(12) United States Patent
Gupta et al.

(10) Patent No.: US 7,425,849 B2
(45) Date of Patent: Sep. 16, 2008

(54) LOW NOISE OUTPUT BUFFER CAPABLE OF OPERATING AT HIGH SPEEDS

(75) Inventors: Ranjeet Gupta, Ghaziabad (IN); Paras Garg, Noida (IN)

(73) Assignee: STMicroelectronics Pvt. Ltd., Noida (IN)

( * ) Notice: Subject to any disclaimer, the term of this patent is extended or adjusted under 35 U.S.C. 154(b) by 54 days.

(21) Appl. No.: 11/319,759

(22) Filed: Dec. 28, 2005

(65) Prior Publication Data

US 2006/0176087 A1      Aug. 10, 2006

(30) Foreign Application Priority Data

Dec. 31, 2004   (IN)   ................... 2615/DEL/2004

(51) Int. Cl.
*H03K 3/00* (2006.01)
(52) U.S. Cl. ...................................... 327/112; 327/170
(58) Field of Classification Search ................. 327/112, 327/170
See application file for complete search history.

(56) References Cited

U.S. PATENT DOCUMENTS

| | | | | |
|---|---|---|---|---|
| 4,857,863 A | * | 8/1989 | Ganger et al. ................ 330/264 |
| 5,315,173 A | * | 5/1994 | Lee et al. ...................... 326/21 |
| 5,440,258 A | * | 8/1995 | Galbi et al. ................... 327/112 |
| 5,736,888 A | * | 4/1998 | Sharpe-Geisler ............. 327/382 |
| 5,777,944 A | * | 7/1998 | Knaack et al. ............ 365/230.06 |
| 5,877,647 A | * | 3/1999 | Vajapey et al. ............... 327/391 |
| 6,366,867 B2 | * | 4/2002 | Sine et al. ..................... 702/107 |
| 6,646,483 B2 | * | 11/2003 | Shin ............................. 327/112 |
| 6,696,860 B2 | * | 2/2004 | Lim et al. ........................ 326/83 |
| 6,958,638 B2 | * | 10/2005 | Shibata et al. ................ 327/170 |
| 6,992,511 B2 | * | 1/2006 | Suzuki ......................... 327/112 |
| 7,099,395 B1 | * | 8/2006 | Sidiropoulos et al. ........ 375/257 |
| 7,170,324 B2 | * | 1/2007 | Huber et al. ................. 327/170 |

* cited by examiner

*Primary Examiner*—Kenneth B. Wells
(74) *Attorney, Agent, or Firm*—Gardere Wynne Sewell LLP

(57) ABSTRACT

Output buffers which operate at high speeds require delicate handling of the noise on the supply lines. This necessitates control be exercised over current slew rate not only on the rising edge of current but also on the falling edge of the current. A circuit provides control over the current slew rate on the falling edge in high speed output driver charging/discharging heavy load without affecting the speed of the driver (which otherwise would have created supply/ground bounce due to parasitics present in the bonding wires, package pins and on-chip metal interconnects in the I/O ring). The control circuit further suppresses the supply/ground noise by a very significant level while incurring small penalty in terms of silicon area and power dissipation. This circuit includes a CMOS circuit that is cross-coupled input connected to the output buffer input signals with a dummy capacitance coupled to the CMOS circuit output.

20 Claims, 6 Drawing Sheets

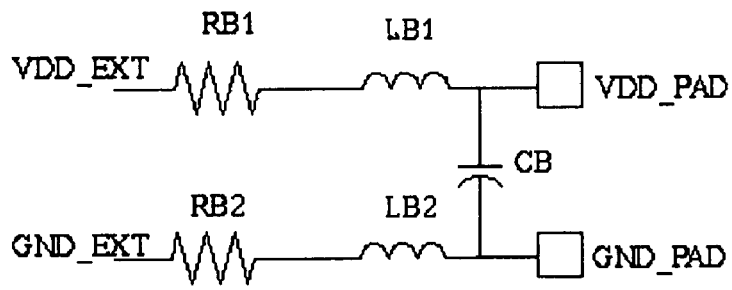

RB1 & RB2 : Trace & Bonding wire Resister
LB1 & LB2: Trace & Bonding wire Inductance
CB       : Trace & Bonding wire Capacitance
VDD_EXT/GND_EXT : External Supplies
VDD_PAD/GND_PAD : Supplies available on PAD

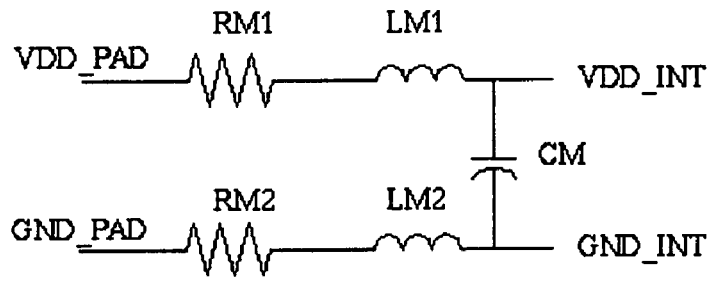

RM1 & RM2: Metal Rail Inerconnection Resistances
LM1 & LM2: Metal Rail Interconnection Inductances
CM       : Metal Rail Capacitances
VDD_INT/GND_INT : Supplies available to Internal Devices

FIGURE 1 *(Prior Art)*

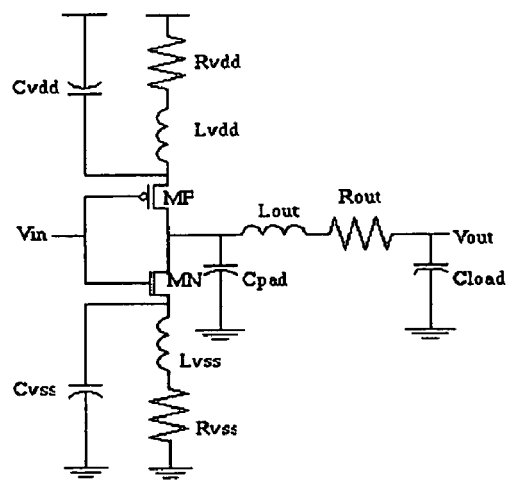

FIGURE 2
*(Prior Art)*

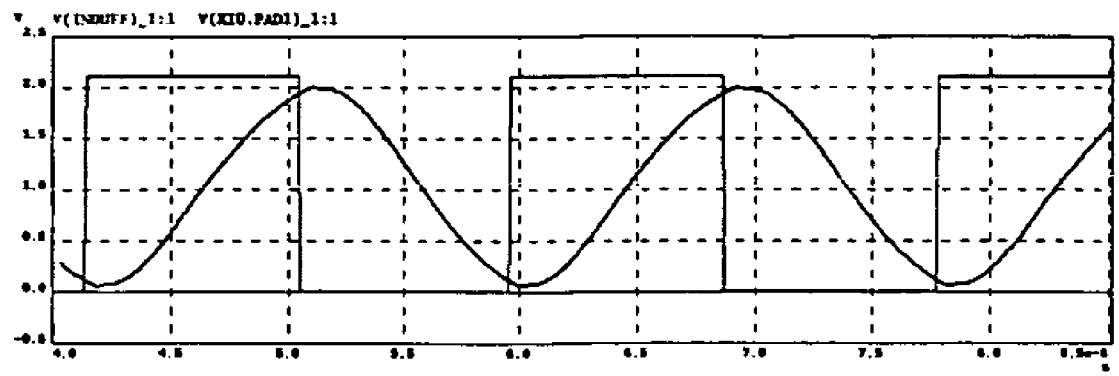
Input & output to the output driver
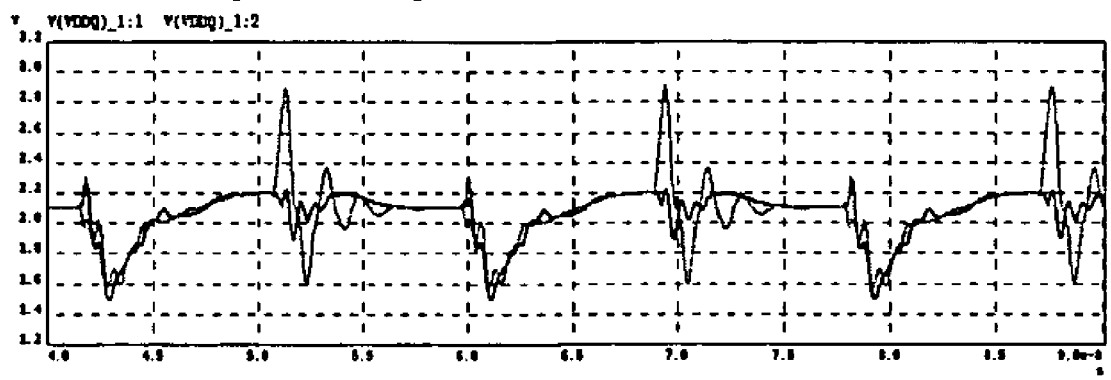
Supply Noise with/without additional circuit
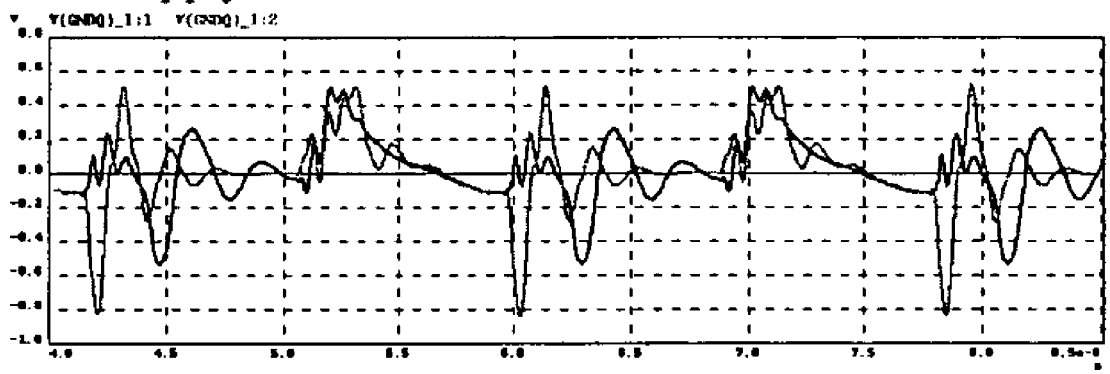
Ground Noise with/without additional circuit
FIGURE 7

LOW NOISE OUTPUT BUFFER CAPABLE OF OPERATING AT HIGH SPEEDS

PRIORITY CLAIM

The present application claims priority from Indian Patent Application No. 2615/Del/2004 filed Dec. 31, 2004, the disclosure of which is hereby incorporated by reference.

BACKGROUND OF THE INVENTION

1. Technical Field of the Invention

The present invention relates to a low noise output buffer capable of operating at high speeds.

2. Description of Related Art

Noise in a power supply is one of the major concerns considered while designing high-speed digital and analog I/O circuits. One of the major sources of supply noise is the switching of output drivers. The faster the I/O, the more current it requires and that implies higher noise. This may cause functional failures on a chip. So, providing a check on noise has become a main concern considered while designing high-speed output drivers.

Further, as CMOS devices are scaled down into the deep sub-micron region, the operating frequency of an output driver is increased (e.g., to frequencies over 50 MHz), which is reflected in terms of a reduction in rise/fall times and pulse widths. High switching speed leads to a fast rate of change of current (di/dt). A Simultaneous Switching Noise (SSN) event is created when many output drivers connected to a single supply switch simultaneously in the presence of a chip-package interface power distribution parasitic. This SSN must be limited to within a maximum allowable noise level in order to guarantee normal functioning of the buffers and the devices connected to the same supply. Therefore, power and ground noise has to be controlled for reliable operation of logic devices. Some of the encountered problems with false operations due to SSN are false triggering, double clocking and/or missing clocked pulses. A typical chip-package interface is shown in FIG. 1.

Supply and ground bounce due to SSN can be expressed as:

$$V\text{bounce} = n*L*di/dt$$

Where n is the number of buffers switching together, L is the cumulative inductance of the trace, bonding wire and metal rail interconnects and di/dt is the rate of change of current of an output driver flowing through the supply and ground pad. As the parameters n and L (due to limitations from packaging) are not within the designer's control, the only quantity that can be controlled is the current slew rate for controlling supply/ground noise.

Supply noise can be suppressed by reducing the rate of change of charging and discharging current at the load. The rate of change of charging/discharging can be monitored by controlling the signals connected to gate of an output driver (i.e., signals GN and GP in FIG. 3) and/or using appropriate sized output driver transistors. The sizes of output driver transistors, however, are fixed due to a requirement that the output impedance match with the characteristic impedance of the transmission line or output drive specification for driving the TTL/CMOS load. FIG. 2 shows an equivalent circuit of an output driver final stage (compare to FIG. 3 components 33, 34 and 35).

FIG. 3 shows a block diagram of conventional compensated CMOS output buffer. It comprises tri-state logic 30, active slew rate control 31, a compensation cell 32, output driver transistors 33 and 34 connected to the output pad of the integrated circuit and a load capacitor 35. The circuit provides for the output buffer being compensated for slew rate at the rising edge only.

Generally, a pre-driver is used for controlling the slope of the signal connected to the gate of the output driver by which the slew on the rising edge can be controlled. The slew on the falling edge can be controlled by sizing of output driver. But in the case of high speed buffers, the output current is quite high due to the low output impedance of the driver when the PAD is at VOH and VOL levels and falls abruptly when the input transitions between low and high. When the input makes a transition from logic low to high, current at the load starts rising first and then starts falling gradually as the output driver PMOS goes into its linear operation region. Also, voltage at the PAD starts rising and reaches the required VOH value, but there is an abrupt fall in the current due to a change in logic at the input (from high to low) of the buffer as shown in waveform 2 of FIG. 4. This steep fall of current from a high value to zero when PMOS goes off at the falling edge of the current creates noise due to the high value of the slew rate when many output buffers switch together.

Thus, a circuit providing slew rate limitation at the falling edge is required.

There is accordingly a need to control the slew rate at the falling edge of current of the CMOS output driver.

There is further a need to provide a low noise output buffer capable of operating at high speeds.

SUMMARY OF THE INVENTION

An embodiment of the proposed invention allows for a smooth current transition as seen by the supply so that di/dt of the current flowing through supply is not too large. An additional current bypass circuit is added to the conventional output buffer circuit that turns on as soon as either of output drive transistors turns off abruptly due to a change in input logic. Thus, the additional current in the bypass circuit adds to the current flowing through the output driver to make it smooth as seen by the supply pad.

A embodiment of the instant invention provides a low noise output buffer capable of operating at high speeds comprising a ground/supply, a main circuit wherein a slew rate limiting means is connected to said ground/supply and said main circuit for the falling edge of the output switching signal.

Said slew rate limiting means include microelectronic transistors connected to said main circuit depending upon the requirement of the main circuit.

Said slew rate limiting means include MOS transistors connected to said main circuit depending upon the requirement of the main circuit.

Said slew rate limiting means include CMOS transistors connected to said main circuit depending upon the requirement of the main circuit.

Said main circuit includes an output buffer.

A method of controlling noise in output buffers capable of operating at high speeds comprises the step of sourcing/sinking the current in the slew rate limiting means at the falling edge of the output switching signal.

In accordance with another embodiment, an output buffer comprises a CMOS output driver having first complementary inputs and a first output, a pre-driver circuit having second complementary inputs and first complementary outputs, the first complementary outputs being coupled to the first complementary inputs, and a falling edge slew rate control circuit coupled to the second complementary inputs.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 1 shows a typical chip package interface parasitics;

FIG. 2 is an Output Driver final stage equivalent circuit;

FIG. 7 shows simulation results for vdd/gnd at 55 MHz at 80 pf load.

DETAILED DESCRIPTION OF THE DRAWINGS

Figure 4:
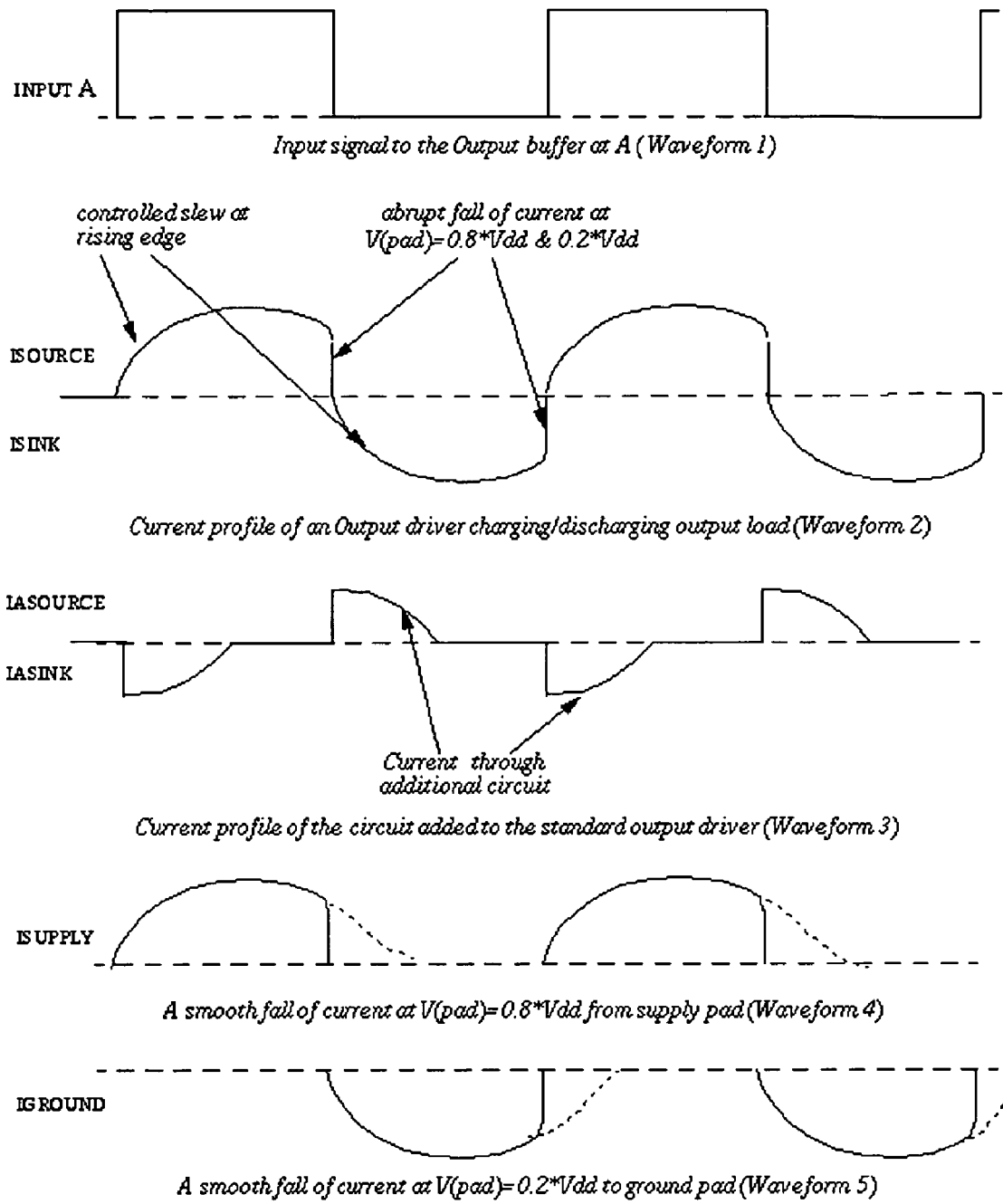
FIG. 4 shows waveforms applicable to operation in accordance with invention.

FIG. 4 shows waveforms applicable to operation in accordance with invention. The first waveform corresponds to an input signal. The proposed circuit senses the change in the logic level of the input signal (waveform 1 of FIG. 4) and triggers on when the output driver transistor goes off. The second waveform corresponds to the current profile of an output driver while charging or discharging the load. The third waveform corresponds to the current profile of the additional circuit for limiting slew rate at the falling edge of the input signal. The fourth and fifth waveforms refer to the smooth curves obtained at source/sink due to the additional circuit.

Figure 5:
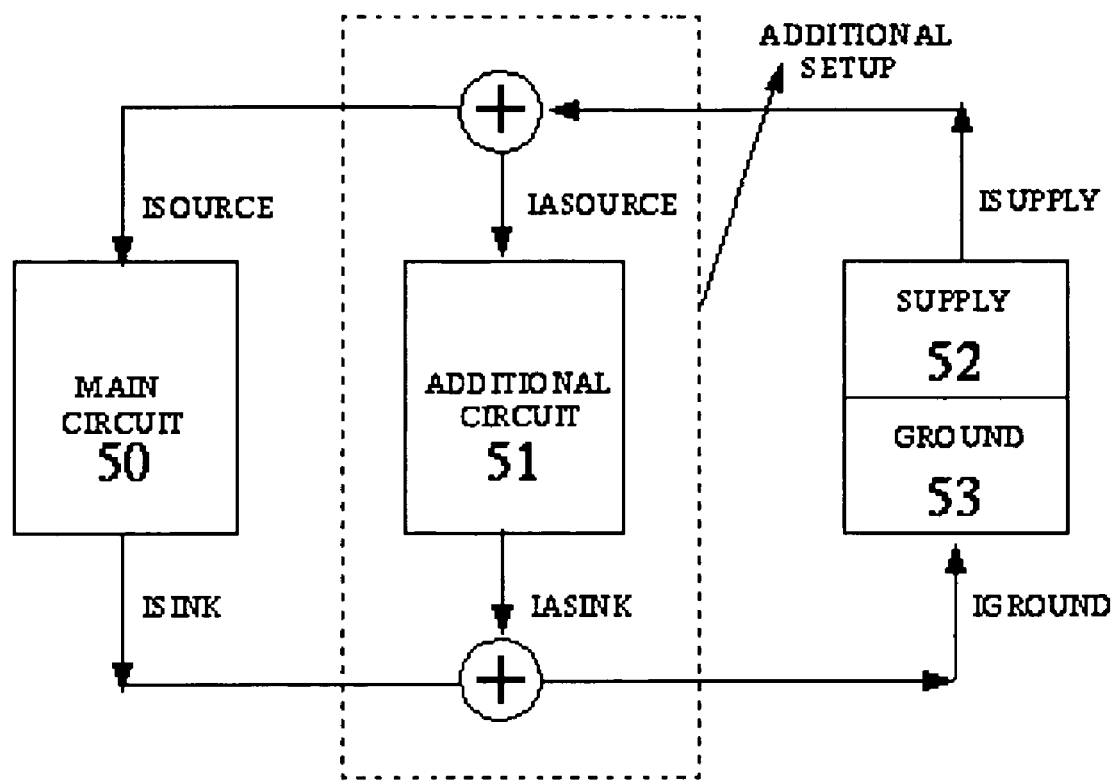
FIG. 5 shows a block diagram of an embodiment of the instant invention.

FIG. 5 shows the block diagram of the instant invention. The circuit consists of a main circuit 50, an additional circuit 51 for providing slew rate limitation at the falling edge and a supply 52/ground 53. The main circuit 50 is basically a circuit for which the slew rate at the falling edge is to be controlled. Both the main circuit 50 and the additional circuit 51 are connected to the supply 52/ground 53 for sourcing or sinking current.

Figure 3:
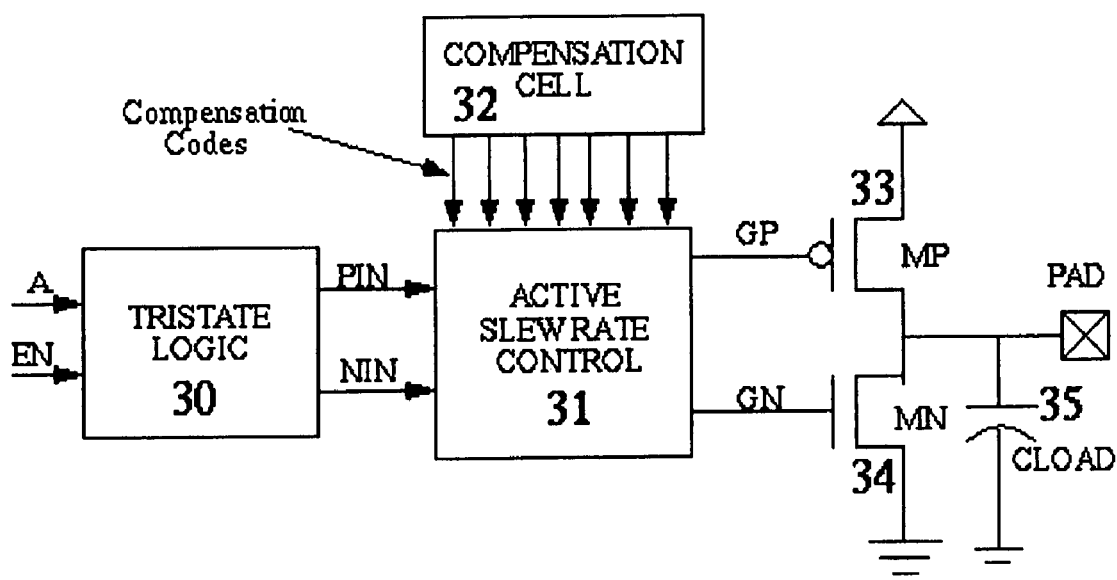
FIG. 3 is a conventional compensated CMOS Output Driver.

When the input signal A (waveform 1 of FIG. 4) is applied, the current in the main circuit 50 starts rising and follows the trajectory as shown in waveform 2 of FIG. 4. It will be seen from the waveform that the slew rate is controlled at the rising edge using a compensation cell 32 (see FIG. 3). As soon as the input signal (waveform 1 of FIG. 4) transitions from high to low, an abrupt fall off of current occurs (waveform 2 of FIG. 4). In order to avoid this abrupt current fall, the additional circuit 51 comes into play with a current profile as shown in waveform 3 of FIG. 4. The additional circuit provides an alternate path to the supply current and therefore removes the possibility of an abrupt transition of current (see, dotted lines in waveforms 4 and 5 of FIG. 4). This is further illustrated using an embodiment.

Figure 6:
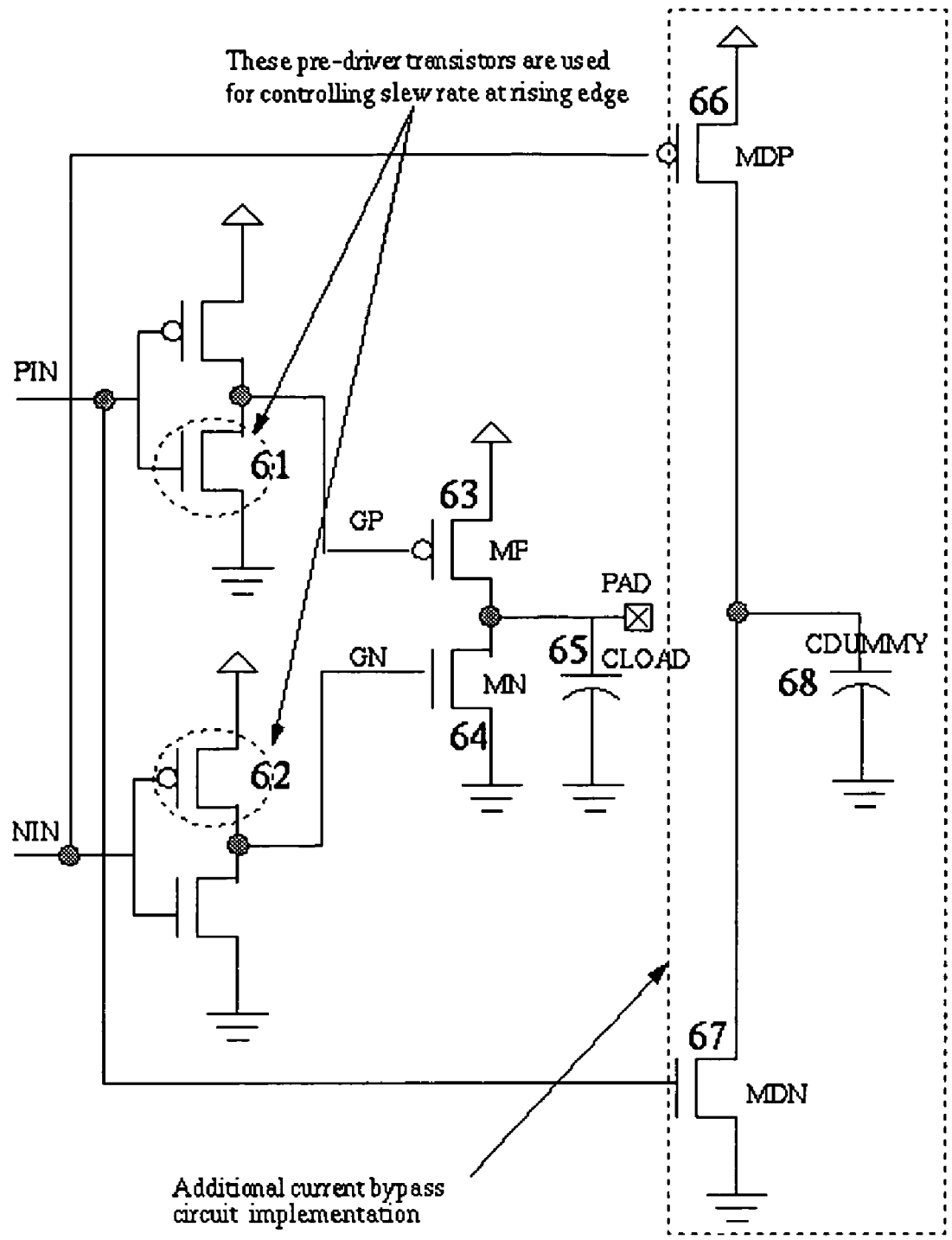
FIG. 6 is a circuit diagram for an embodiment of the instant invention.

Referring to FIG. 6 (in combination with FIG. 3), the NIN and PIN signals are delayed versions of the input signal A. When EN is logic HIGH, the output driver is tri-stated, signal PIN goes low (GP goes high) and NIN goes high (GN goes low). The nodes GN and GP are their slew controlled using pre-driver transistors 61 and 62. When output driver PMOS 63 is ON (Input high), the voltage at node GP is controlled (slowly decreased) to control the slew rate at the rising edge. In the same way, signal at node GN is controlled when output driver NMOS 64 is ON. So, when input changes from high to low (i.e. node GP goes from low to high), output driver PMOS 63 goes off and because of its very high drive, current falls abruptly from high value to zero (see, waveform 2 of FIG. 4). To avoid the abrupt change in the current from the supply, a PMOS 66 is turned on using signal NIN that goes low (when GP goes high) while the falling of the current from supply is controlled by charging the capacitor 68. The same process is followed when input goes low and the additional circuit NMOS 67 turns on to discharge the capacitor 68. The inputs of the circuit 66/67 are accordingly cross-coupled connected to the NIN/PIN inputs.

The sizes of the transistors 66 and 67 and capacitor 68 are calculated using simple analysis. In the present case this circuit is designed to operate at 55 Mhz at 80 pf capacitive load with the specification that the output driver have a maximum slew rate of 20 mA/ns and output impedance of 50 ohms. Specified values of the VOH and VOL are 0.8*Vdd and 0.2*Vdd, respectively. The peak current of the transistors 66 and 67 can be set to the same value of the output current when the input makes a transition (i.e. when the voltage at PAD crosses VOH for 66 and VOL for 67). The value of the capacitor 68 can be set for the desired falling slew rate of the supply current.

SIMULATION RESULTS: FIG. 7 shows three graphs plotted to show the noise reduction using the instant invention over the prior art.

The first diagram shows the pulse input and output of the output driver.

The second diagram shows the noise in the 2.1V supply with and without using additional circuit. It can be seen that there is not much of a difference in the noise at the rising edge but the noise at falling edge is drastically reduced.

The third diagram shows the ground noise with and without additional circuit. The difference in the ground noise at the falling edge of the current can be seen. The results have also been tabulated in Table 1.

TABLE 1

| Supply/ground noise comparison | | |
|---|---|---|
| | Bounce/drop(max) with add. ckt | Bounce/drop(max) without add. ckt |
| Vdd bounce/drop | 0.55 V | 0.81 V |
| Gnd bounce/drop | 0.52 V | 0.84 V |

When the additional circuit of the proposed invention is used, at lower frequencies output driver current has enough time to come down to low value. This creates a small spike of current due to the additional circuit which adds a bounce to the supply, but it is ensured that the bounce created is not going to affect normal operation as the level of bounce created is lower than the bounce created by the rising edge slew of the current.

Looking at the results, it can be concluded that the above-mentioned invention for controlling slew rate is very effective if the output driver is used at a predetermined frequency. This circuit has been designed for a worst case where the effect of noise on the driver is maximum. But the proposed circuit can provide compensation through use of the digital codes from the compensation cell to make it even more effective at the slow corners. This is a novel method/apparatus to increase operating frequency without increase in supply/ground bounce.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A low noise output buffer comprising:
   a ground/supply,
   a main circuit for generating an output signal at a first output node, the main circuit connected between said ground/supply, and
   a slew rate limiting means connected between said ground/supply for controlling slew rate of a falling edge of the output signal and having a second output node,
   wherein logic states of the output signal at the first output node are not dependent upon any signal at the second output node.

2. The low noise output buffer as claimed in claim 1 wherein said slew rate limiting means comprises a pair of transistors coupled in series at the second output node and whose control terminals are connected to inputs of said main circuit.

3. The low noise output buffer as claimed in claim 2 wherein said transistors are MOS transistors.

4. The low noise output buffer as claimed in claim 1 further comprising a dummy capacitance coupled to the second output node.

5. The low noise output buffer as claimed in claim 1 wherein said main circuit includes an output buffer.

6. An output buffer, comprising:
   a CMOS output driver having first complementary inputs and a first output;
   a pre-driver circuit having second complementary inputs and first complementary outputs, the first complementary outputs being coupled to the first complementary inputs; and
   a falling edge slew rate control circuit coupled to the second complementary inputs, wherein the falling edge slew rate control circuit comprises a CMOS transistor circuit having third complementary inputs,
   wherein the third complementary inputs are cross connected to the second complementary inputs,
   wherein a dummy capacitance is coupled to a connection node between transistors of the CMOS transistor circuit, and
   wherein logic states at the first output of the CMOS output driver and first complementary outputs of the pre-driver circuit do not depend on a signal generated by the falling edge slew rate control circuit.

7. The output buffer of claim 6 wherein the pre-driver circuit includes a rising edge slew rate control circuit.

8. The output buffer of claim 6 wherein a value of the dummy capacitance is selected to set a desired falling edge slew rate.

9. The output buffer of claim 6 wherein the CMOS transistor circuit has a second output and the second output is not directly connected to the first output.

10. The output buffer of claim 9 wherein the dummy capacitance is coupled to the second output.

11. The output buffer of claim 9 wherein the first output is a pad of an integrated circuit.

12. The output buffer of claim 11 further comprising an output capacitance coupled to the first output.

13. The output buffer of claim 6 wherein the CMOS output driver, the pre-driver circuit and the falling edge slew rate control circuit are all coupled between a common supply voltage and a common ground voltage.

14. The output buffer of claim 13 wherein the falling edge slew rate control circuit comprises a CMOS transistor circuit having third complementary inputs and a second output, wherein the third complementary inputs are cross connected to the second complementary inputs and the second output is not directly connected to the first output.

15. The output buffer of claim 14 wherein the first output is coupled to a pad of an integrated circuit.

16. A low noise output buffer, comprising:
   a ground terminal and a supply voltage terminal,
   a buffer circuit connected between the ground terminal and the supply voltage terminal which receives an input signal and generates an output signal, and
   a slew rate limiting circuit connected between the ground terminal and the supply voltage terminal which also receives the input signal and in response thereto during an edge change of the output signal shapes current being sourced from the supply voltage terminal to the buffer and shapes current being sunk to the ground terminal from the buffer circuit,
   wherein logic states of the output signal from to the buffer circuit are not dependent upon a signal generated by the slew rate limiting circuit.

17. The buffer of claim 16 wherein the slew rate limiting circuit removes current from the supply voltage terminal at a falling edge of the output signal and supplies current to the ground terminal at a rising edge of the output signal.

18. An output buffer, comprising:
   a power supply input sourcing a supply current;
   a pre-driver circuit receiving the supply and having first complementary inputs and first complementary outputs;
   a CMOS output driver receiving the supply current and having second complementary inputs and a first output, the second complementary inputs being coupled to the first complementary outputs; and
   a falling edge slew rate control circuit coupled to the power supply input and operating responsive to the first complementary inputs of the pre-driver circuit, the control circuit sinking current from the power supply input when a signal received at the first complementary inputs would cause the CMOS output driver to produce an output signal with a falling edge,
   wherein neither the pre-driver circuit nor the CMOS output driver generate any signal whose logic states are dependent upon an output of the falling edge slew rate control circuit.

19. A low noise output buffer, comprising:
   a ground terminal and a supply voltage terminal,
   a buffer circuit connected between the ground terminal and the supply voltage terminal which receives an input signal and generates an output signal, and
   a slew rate limiting circuit connected between the ground terminal and the supply voltage terminal which also receives the input signal and in response thereto controls changes in a magnitude of current being sourced from the supply voltage terminal to the buffer circuit or sunk to the ground terminal from the buffer circuit due to an edge change of the buffer circuit output signal, the slew rate limiting circuit comprising a pair of MOS transistors connected in series at a node and a dummy capacitor coupled to the node,
   wherein logic states of the buffer circuit output signal do not depend on a signal output from the slew rate limiting circuit.

20. An output buffer, comprising:
   a first CMOS inverter having a first input coupled to receive a first complementary input signal and having a first output;

a second CMOS inverter having a second input coupled to receive a second complementary input signal and having a second output;

a first p-channel transistor having a gate coupled to the first output;

a first n-channel transistor having a gate coupled to the second output, wherein the first p-channel transistor and first n-channel transistor are series connected at their drain nodes to form a third output;

a second p-channel transistor having a gate coupled to receive the second complementary input;

a second n-channel transistor having a gate coupled to receive the first complementary input, wherein the second p-channel transistor and second n-channel transistor are series connected at their drain nodes to form a fourth output; and a capacitor coupled between the fourth output and a reference voltage.

* * * * *

UNITED STATES PATENT AND TRADEMARK OFFICE
CERTIFICATE OF CORRECTION

| | | |
|---|---|---|
| PATENT NO. | : 7,425,849 B2 | Page 1 of 1 |
| APPLICATION NO. | : 11/319759 | |
| DATED | : September 16, 2008 | |
| INVENTOR(S) | : Ranjeet Gupta et al. | |

It is certified that error appears in the above-identified patent and that said Letters Patent is hereby corrected as shown below:

At column 6, claim 16, line 19, delete the word "to".

Signed and Sealed this
Second Day of August, 2011

David J. Kappos
*Director of the United States Patent and Trademark Office*